June 23, 1964 E. G. BYLANDER ETAL 3,138,495

SEMICONDUCTOR DEVICE AND METHOD OF MANUFACTURE

Filed July 28, 1961

Ernest G. Bylander
Walter R. Runyan
INVENTORS.

BY John G. Graham

United States Patent Office 3,138,495

Patented June 23, 1964

3,138,495

SEMICONDUCTOR DEVICE AND METHOD OF MANUFACTURE

Ernest G. Bylander, Garland, and Walter R. Runyan, Dallas, Tex., assignors to Texas Instruments Incorporated, Dallas, Tex., a corporation of Delaware Filed July 28, 1961, Ser. No. 127,539

6 Claims. (Cl. 148—187)

This invention relates to a semiconductor device having a diffused P-N junction therein, and more particularly to a photovoltaic infrared radiation detector employing a compound semiconductor device and a fabrication technique therefor.

Compound semiconductors such as indium antimonide, indium arsenide, etc. exhibit a narrow band gap and are particularly well-suited as infrared radiation detectors. These detectors take the form of photovoltaic devices employing P-N junctions and are adapted to generate a voltage when excited by radiation. The detector devices must have a relatively high internal impedance so that a high output level may be obtained at a low signal-to-noise ratio. Also, since the body of the detector is not ordinarily transparent to the radiation of interest, the junction must be very shallow so that a minimum of losses occur in the device before the radiation sensitive area or the P-N junction is reached. Previously used impurity materials such as zinc or cadmium, when diffused into a compound semiconductor such as indium antimonide to form a P-N junction, produce excess surface concentration and surface alloying so that spectral response is severely degraded and the impedance and output voltage are very low. Other techniques such as out-diffusion may provide adequate spectral response and high impedance, but produce very erratic, unpredictable results.

It is a principal object of this invention to provide an improved method of forming a P-N junction in a semiconductor device. An additional object is to provide a method of forming a P-N junction in a semiconductor device at a very shallow depth. Another object is to provide an improved radiation-sensitive compound semiconductor device having a diffused P-N junction. A further object is to provide a readily controllable method of diffusing an impurity such as copper into a compound semiconductor such as indium antimonide.

In accordance with an illustrative embodiment of this invention, a semiconductor device having a P-N junction and being particularly adapted for radiation detection is formed by first applying a thin transparent coating of copper on one surface of a wafer of compound semiconductor material such as indium antimonide. If the wafer has been previously treated to produce N-type conductivity, the copper will form a diffused P-type region if subjected to a diffusion step. That is, the copper-coated indium antimonide wafer is heated to allow the copper to diffuse into the wafer and create a P-N junction, this junction existing only at very low temperatures for indium antimonide. The amount of copper deposited upon the surface of the wafer must be extremely small so that it will be transparent to infrared. Also, to retard diffusion and junction depth, it may be necessary to employ an oxide layer between the evaporated copper and the wafer.

The novel features believed characteristic of this invention are set forth in the appended claims. The invention itself, however, along with further objects and advantages thereof, may best be understood from the following detailed description, when read in conjunction with the accompanying drawing, wherein:

Figure 1:
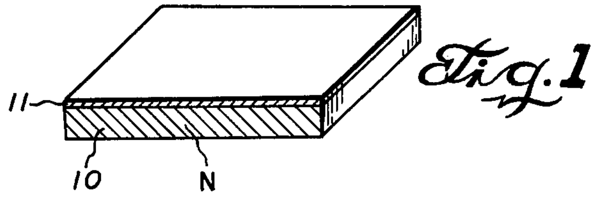
FIGURE 1 is a pictorial representation, in section, of a compound semiconductor device in an initial state of manufacture.
Figure 2:
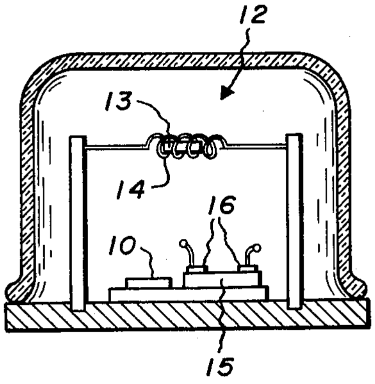
FIGURE 2 is a schematic representation in section of an evacuation chamber suitable for use in the process of this invention.
Figure 3:
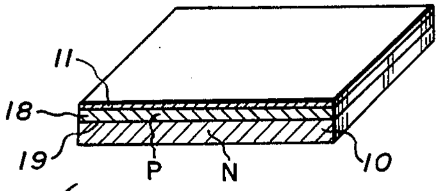
FIGURE 3 is a pictorial view, in section, of the device of FIGURE 1 in an intermediate stage of manufacture.

With reference to FIGURE 1, a wafer 10, preferably composed of indium antimonide, is used as a starting material for forming a radiation sensitive device according to this invention. The wafer 10 may be about 20 mils in thickness, and is previously treated to exhibit a given conductivity type at a suitable resistivity. Preferably, the wafer 10 is N-type containing a donor impurity such as tellurium at a concentration of about $10^{14}$ atoms per cubic centimeter, providing a resistivity at about —200° C. of around 0.055 ohm-centimeter. Values of resistivity much greater than this, and also down to a value of about 0.02 ohm-centimeter are suitable, the specific value being primarily of interest in determining diffusion times. The top surface of the wafer 10 is prepared by polishing and chemically cleaning to provide an optically smooth and impurity-free surface for the deposition of the material which will subsequently act as the impurity. An extremely thin coating 11 of copper or other noble metal is then formed on the prepared surface by a technique such as evaporation. For example, the copper coating 11 may be formed by placing the wafer 10 in an evacuated chamber 12 as seen in FIGURE 2 and then evaporating a small quantity of copper 13 from a heating coil 14 spaced from the wafer. The thickness of the copper coating 11 is very critical since it must be transparent to the infrared radiation of interest. The amount of copper deposited on the wafer during evaporation is therefore controlled by placing a sapphire wafer 15 beside the wafer 10 and continuously measuring the resistance between a pair of contacts 16 on the sapphire. This resistance is of course measured by an ohmmeter connected to leads brought out through the base plate of the evaporation chamber. The evaporation is stopped when this resistance falls to a value of around one megohm. The amount of copper deposited upon the wafer 10 may also be determined by measuring the transmissivity of the sapphire wafer 15 after the evaporation step. For suitable copper coating amounts, the transmissivity to 5 micron infrared will be about 95%, and to visible light about 20%. The thickness of the copper coating 11 is not measurable by ordinary techniques, but is calculated to only a few molecular layers, possibly not over 100. It is not necessary for the copper to completely cover the surface of the wafer, but instead copper molecules may be spaced about the surface. A thickness of about 10,000 A. or 0.04 mil is probably the upper limit for the copper plating, any more than this adversely affecting the transmissivity.

The indium antimonide wafer with the top surface coated with copper is then subjected to a diffusion process. The wafer 10 is heated in an inert atmosphere or in vacuum so that the copper will diffuse into the indium antimonide to form a P-type layer or region 18 in the formerly N-type material. A P-N junction 19 will then be defined at the interface between P-type region 18 and the remaining N-type region of the wafer 10. A suitable temperature for diffusing copper into indium antimonide is about 380° C., although any temperature in the range of about 360° to 400° C. may be used. The diffusion depth will vary depending upon the qualities of each individual indium antimonide crystal, but a diffusion time of about 16 minutes ±5 minutes at 380° C. produces a P-type layer 18 having a suitable depth. Other conditions will provide adequate P-N junctions, but this combination will produce devices particularly well adapted for radiation detectors. The depth of the P-N junction 19 is estimated to be about 0.2 to 0.5 micron for the techniques described above. This is considerably less than would be expected for the diffusion times used, and the reason for the shallow diffusion is believed to be the existance of an indium oxide layer on the surface of the wafer 10 underlying the copper coating 11. This oxide layer impedes the diffusion of copper into the indium antimonide, and is formed by incidental exposure of the wafer to air or other oxygen-containing material during preparation. The thickness of the indium oxide layer is self-limiting and requires only that a uniform etching procedure, for surface polishing prior to evaporation, be used.

The P-N junction 19 referred to above, as well as the semiconductive properties of indium antimonide itself, exist only at very low temperatures, below about −145° C. Infrared detectors using indium antimonide may be operated by using liquid nitrogen, which maintains a temperature of about −195° C., as a cooling agent.

Figure 5:
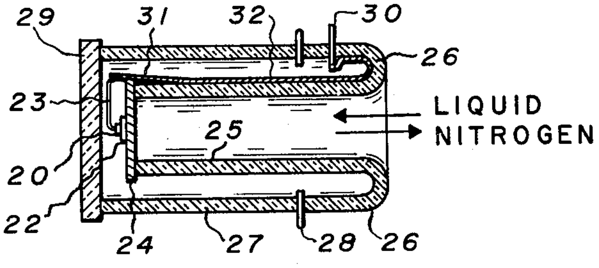
FIGURE 5 is a sectional view of an infrared detector utilizing the device of FIGURE 4.
Figure 4:
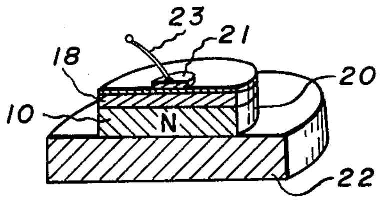
FIGURE 4 is a pictorial view, in section, of a completed semiconductor device incorporating the principles of this invention.

The fabrication of the device is completed by cutting the wafer into discs 20 of a suitable size such as about 50 mils diameter, as seen in FIGURE 4. Electrical contacts are then applied to the N- and P-type regions 10 and 18 in the form of a 5 mil diameter conductive dot 21 and a base plate 22. These contacts 21 and 22 may be formed by conventional techniques, such as evaporation or alloying an indium dot on the upper surface and alloying a tin base plate to the lower surface. A lead 23 is connected to the contact 21 by a procedure such as ball bonding. The device may then be mounted in a suitable structure as seen in FIGURE 5 adapted to cool the disc with liquid nitrogen and to expose the upper surface of the device to the infrared radiation which is to be detected and measured. The tin plate 22 having the indium antimonide disc 20 thereon is secured to a Kovar disc 24 which is sealed to one end of a glass cylinder 25. The cylinder 25 has an inverted lip 26 at the other end, and an outer glass cylinder 27 is secured to the edge of the lip by a sealing ring 28. A sapphire window 29, transparent to infrared, closes off the other end of the cylinder 27 so that the chamber housing the disc 20 may be evacuated or filled with inert gas. The interior of the cylinder 25 serves as a passageway for the admission of liquid nitrogen for cooling the back of the Kovar disc 24. The P-type region 18 of the disc 20 is connected to a terminal electrode 30 which penetrates the lip 26 by means of the indium dot 21, the lead wire 23, a conductive bar 31, and a strip 32 of conductive paint. The N-type region 10 of the disc is likewise connected to a terminal electrode which penetrates the lip 26 by means of the plate 22, the disc 24, and a strip of conducting paint not seen in the view of FIGURE 5.

Radiaiton detectors formed according to this invention may exhibit detectivities of about $18 \times 10^{-9}$ or more, this being around twice as great as heretofore available. Also, internal impedances of 4000–10,000 ohms may be obtained in the photovoltaic devices obtained by the techniques herein set forth. This magnitude of impedance is orders of magnitude greater than previously provided.

Of course, P-N junctions formed according to this invention may be used in other compound semiconductor devices rather than only raidation detectors. Also, it is well known that copper will convert the conductivity type of germanium, gallium arsenide, and indium arsenide, as well as other III–V compound semiconductors. Thus, while this invention has been described with reference to a specific embodiment, the description is not meant to be construed in a limting sense. It is understood that various modifications may be made by persons skilled in the art, and it is therefore contemplated that the appended claims will cover any such modifications as fall within the true scope of the invention.

What is claimed is:

1. A method of fabricating a semiconductor device comprising the steps of preparing a wafer of N-type indium antimonide having a thin coating of indium oxide on one surface thereof, evaporating a copper coating on said surface over said oxide coating to a thickness of less than one micron, heating said wafer for a period of at least 5 minutes at a temperature of from 360° C. to 400° C. to form a thin diffused P-type region adjacent said surface, and applying electrical contacts to said region and to said wafer.

2. A method of making an infrared detector comprising the steps of providing a wafer of N-type indium antimonide, forming a thin layer of indium oxide on one surface of said wafer, forming a thin transparent coating of copper on said one surface of said wafer overlying said layer of indium oxide, said copper coating being at least about 95% transparent to infrared radiation, thereafter heating said copper coated wafer for a period of at least five minutes and at a temperautre of about 360° C. to 400° C. to cause copper to diffuse from said copper coating into said N-type wafer through said indium oxide layer to form a thin diffused P-type region adjacent said surface underlying said copper coating, and applying electrical contacts to said P-type region and to a said portion of said N-type wafer spaced from said P-type region.

3. A method of fabricating a semiconductor device comprising the steps of preparing a wafer of N-type indium antimonide having a thin coating of indium oxide on one surface thereof, evaporating a copper coating on said surface over said oxide coating to a thickness of less than one micron, heating said copper coated wafer for a period of at least five minutes at a temperature of about 360° C. to 400° C. to cause copper to diffuse from said copper coating through said oxide layer into said N-type wafer adjacent said surface to form a thin diffused P-type region in said wafer adjacent said surface, and applying electrical contacts to said region and to said wafer.

4. A semiconductor device comprising a wafer of N-type indium antimonide having a resistivity greater than 0.02 ohm-centimeter, a thin layer of indium oxide adherent to one surface of said wafer, a coating of copper overlying said oxide layer on said surface, said coating being at least about 95% transparent to infrared radiation, and a diffused region of P-type conductivity defined in the N-type wafer adjacent said surface, said region having a thickness of less than 0.02 mil, said region having an excess of acceptor impurities in the form of copper diffused from said coating through said oxide layer.

5. A semiconductor device comprising a wafer of N-type monocrystalline indium antimonide, a thin layer of indium oxide adherent to one surface of said wafer, a thin transparent copper coating overlying and adherent to said oxide layer of said surface, said coating of copper being at least about 95% transparent to infrared radiation, a thin diffused layer of P-type conductivity defined in said N-type wafer adjacent said surface and underlying said copper coating, said diffused layer having an excess of acceptor impurities in the form of copper diffused from said copper coating through said oxide layer.

6. An infrared detector comprising a wafer of N-type indium antimonide, a thin layer of indium oxide formed on one surface of said wafer, a thin transparent coating of copper overlying said oxide layer on said surface and adherent to said surface, said copper coating being at least about 95% transparent to infrared radiation, a thin diffused region of P-type conductivity defined in said N-type wafer adjacent said surface and underlying said copper coating, said diffused P-type conductivity region containing an excess of acceptor impurities in the form of copper diffused from said copper coating through said oxide layer, and first conductive means contacting said diffused region and second conductive means contacting said N-type wafer at a portion thereof spaced from said P-type diffused region.

References Cited in the file of this patent

UNITED STATES PATENTS

| | | |
|---|---|---|
| 2,622,117 | Benzer | Dec. 16, 1952 |
| 2,766,144 | Lidow | Oct. 9, 1956 |
| 2,802,760 | Derick et al. | Aug. 13, 1957 |
| 2,807,561 | Nelson | Sept. 24, 1957 |
| 2,873,303 | Rittner | Feb. 10, 1959 |
| 2,937,961 | Wolsky | May 24, 1960 |
| 2,963,390 | Dickson | Dec. 6, 1960 |

OTHER REFERENCES

Hilsum et al.: Semiconducting III–V Compounds, Pergamon Press, New York, 1961, pages 70 and 87.

Hannay: "Semiconductors," Reinhold Publishing Corporation, New York, 1959, pages 451 and 478.